United States Patent
Cohen et al.

(10) Patent No.: US 6,774,015 B1
(45) Date of Patent: Aug. 10, 2004

(54) STRAINED SILICON-ON-INSULATOR (SSOI) AND METHOD TO FORM THE SAME

(75) Inventors: Guy Moshe Cohen, Mohegan Lake, NY (US); Silke Hildegard Christiansen, Halle (DE)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/326,437

(22) Filed: Dec. 19, 2002

(51) Int. Cl.[7] ............................................. H01L 21/20
(52) U.S. Cl. ...................... 438/479; 438/486; 438/766; 438/404
(58) Field of Search ................................ 438/479, 486, 438/766, 404; 257/347, 49, 65, 70, 75

(56) References Cited

U.S. PATENT DOCUMENTS

| | | | |
|---|---|---|---|
| 5,461,250 A | * | 10/1995 | Burghartz et al. .......... 257/347 |
| 5,759,898 A | | 6/1998 | Ek ............................. 438/291 |
| 6,429,061 B1 | | 8/2002 | Rim ........................... 438/198 |
| 6,593,641 B1 | | 7/2003 | Fitzergald ................... 257/616 |
| 6,607,948 B1 | * | 8/2003 | Sugiyama et al. .......... 438/151 |

* cited by examiner

*Primary Examiner*—Amir Zarabian
*Assistant Examiner*—Christy Novacek
(74) *Attorney, Agent, or Firm*—George Sai-Halasz

(57) ABSTRACT

A method for fabricating a strained Si layer on insulator, a structure of the strained Si layer on insulator, and electronic systems comprising such layers are disclosed. The method comprises the steps of forming epitaxially a relaxed SiGe layer on top of a Si layer on insulator; transforming the crystalline Si layer and the lower portion of the crystalline relaxed SiGe layer into an amorphous material state by ion implantation; and re-crystallizing the amorphous material from the crystalline top portion of the SiGe layer. The larger lattice constant of the SiGe seed layer forces a tensile strain in the Si layer.

21 Claims, 5 Drawing Sheets

STRAINED SILICON-ON-INSULATOR (SSOI) AND METHOD TO FORM THE SAME

FIELD OF THE INVENTION

The present invention relates to a structure of a tensilely strained silicon layer on an insulator, and to a method to fabricate the same. The invention also teaches systems comprising the strained silicon layer on an insulator. Furthermore, the invention relates to a method for changing the state of strain of thin crystalline layers.

BACKGROUND OF THE INVENTION

Today's integrated circuits include a vast number of devices. Smaller devices are key to enhance performance and to improve reliability. As MOSFET (Metal Oxide Semiconductor Field-Effect-Transistor, a name with historic connotations meaning in general an insulated gate Field-Effect-Transistor) devices are being scaled down, however, the technology becomes more complex and changes in device structures and new fabrication methods are needed to maintain the expected performance enhancement from one generation of devices to the next. In this regard the semiconductor that has progressed the farthest is the primary semiconducting material of microelectronics: silicon (Si).

There is great difficulty in maintaining performance improvements in devices of deeply submicron generations. Several avenues are being explored for keeping device performance improvements on track. Among these is the use of tensilely strained Si as the basic semiconducting device material.

A MOSFET fabricated in tensile strained Si exhibits higher carrier mobilities than conventional MOSFET as it was shown for instance by K. Rim, et al in "Enhanced performance in surface channel strained Si n and p MOSFETs", Proceedings of the Twenty Sixth International Symposium on Compound Semiconductors Berlin, Germany 22–26 Aug. 1999. The strained Si layer is typically formed by growing Si epitaxialy over a relaxed graded SiGe buffer layer as discussed in Materials Science and Engineering Reports R17, 105 (1996), by P. M. Mooney, and in U.S. Pat. No. 5,659,187 to LeGoues et al. titled: "Low Defect Density/arbitrary Lattice Constant Heteroepitaxial Layers" incorporated herein by reference.

While the relaxed SiGe layer is essential for straining the Si layer, this layer stack cannot be used for making silicon-on-insulator (SOI) MOSFETs. Often today's state of the art devices operate in a semiconducting layer which is separated from the semiconducting substrate by an insulating layer. This technology is commonly knows as SOI technology. The standard method of producing SOI materials, or wafers, is called the SIMOX process. It involves the implantation of very high doses of oxygen ions at high energy into the semiconductor, and upon annealing, the oxygen forms an oxide layer under the surface of the semiconductor. In this manner one has a top semiconductor layer separated from the bulk of the substrate. However there are other methods besides SIMOX for producing SOI wafers, methods typically based on wafer bonding techniques.

A strained silicon layer on a relaxed SiGe layer is only useful for making bulk devices. Bulk devices do not have the advantages obtained for SOI devices such as reduction in the junction capacitance, and elimination of latch-up path between devices, as it is detailed, for instance in J-P. Colinge, Silicon-On-Insulator Technology: Materials to VLSI, 2nd Ed., Kluwer Academic Press, Boston, 1997.

Ultimately, an SOI technology having a tensile strained Si layer made directly on insulator is desired, thus combining the advantages of SOI technology with the mobility enhancement obtain in strained silicon. In addition, issues related to the use of SiGe as the device substrate are eliminated. For example, cobalt disilicide forming at higher temperature in SiGe than in pure Si—shown by R. A Donaton et al., "Co silicide formation on SiGeC/Si and SiGe/Si layers", Appl. Phys. Lett., 70, p. 1266, (1997),—and higher dopant diffusion are major concerns in the fabrication of a strained silicon MOSFET over SiGe.

A strained silicon layer over an isolator can be formed by wafer bonding and layer transfer. A first wafer with a strained silicon layer grown over a SiGe buffer layer is implanted with hydrogen—in a method called SmartCut (a registered trademark of SOITEC Corporation) as described by A. J. Auberton Herve, "SOI: materials to systems", International Electron Devices Meeting (IEDM) Technical Digest, San Francisco, p. 3–10, Dec. 1996,—and then flipped and bonded to a handle wafer having the isolator layer. The joint wafers are annealed to strengthen the bond and to obtain blistering at about the depth were the hydrogen was implanted. The strain silicon layer and a portion of the SiGe buffer layer are thus separated from the first wafer, and transferred by bonding to the handle wafer. There are disadvantages to this approach. First, the bonding method requires wafer bonding and layer transfer, which are expensive and relatively low yield processes. Second, the as-deposited SiGe surface is too rough for wafer bonding, which can be achieved only with very smooth and flat surfaces. As a result a long chemical mechanical polishing (CMP) step is typically applied to reduce the surface roughness to an acceptable level. Third, to obtain a strong bond the wafers need to be annealed at a temperature of over 1000° C. However, such a high temperature will cause the strained silicon layer to relax and to diffuse Ge from the SiGe buffer into the strained silicon layer. Fourth, the lower anneal temperature that is therefore used can lead to reliability issues. Fifth, a SmartCut process in which hydrogen is implanted into the SiGe buffer layer may be difficult to control since the hydrogen will partially relocate to defects in the SiGe layer which are distant from the blistering location.

SUMMARY OF THE INVENTION

In view of the problems discussed above this invention discloses a method for forming a tensilely strained SOI layer, and discloses a structure of a tensilely strained SOI layer.

It is noted that, for the sake of simplicity, the discussion here is for the specific case of tensile strained silicon. Although strained silicon may be of special interest due to its superior properties, one skilled in the art would notice that the method is general, and applicable to other semiconductor layers, such as SiGe, SiC, GaAs, InP, InGaAs etc. Or, more generally, the method can be extended to change the state of a strain, both in a quantitative manner, for instance to increase the amount of compression or tension in a layer, and in a qualitative manner, for instance to transform from compressive to tensile strain, and to do such strain change in a wide range of materials, not necessarily only in semiconductors.

The basic invention to create a tensile strain in a Si layer on top an insulator is as follows. One starts with, or take, a standard SOI wafer with a relaxed Si layer, a well known structure in the art. Then, one forms on the top of the Si layer a relaxed SiGe layer, having a given Ge concentration at the top portion of the SiGe layer. The term relaxed means that the a layer is essentially not under strain or stress, but is able to relax by assuming its equilibrium lattice constant. In practice, however, the layer relaxation may not be full (i.e. 100% relaxation) and the actual relaxation amount depends on the method used to relax the strain in the SiGe film and on the film thickness. For example, 65% relaxation was reported in SiGe films with 30% Ge grown on silicon and relaxed by ion implantation and rapid thermal anneal (H.-J. Herzog et. al, "Si/SiGe n-MODFETs on Thin SiGe Virtual Substrates Prepared by Means of He Implantation", IEEE ELECTRON DEVICE LETTERS, p. 485, 23(8), August 2002). A relaxed SiGe layer can be formed by growing a pseudomorphic SiGe layer with a uniform Ge concentration, implanting helium or hydrogen and annealing the film to relax the strain. Alternatively, the a relaxed SiGe layer can be realized by growing a thick SiGe layer with a graded Ge composition. In the later case at the interface with the Si layer the Ge concentration is relatively low, and the lattice constant is not much larger than the Si layer lattice constant, but the mismatch with the Si lattice constant can be significant toward the top of the SiGe layer, due to the higher Ge concentration found there. Next, the relaxed Si layer on top of the insulator, and the bottom portion of the relaxed SiGe layer is amorphized by ion implantation. In this manner one has a monocrystalline SiGe layer on top of an amorphous material. Following the amorphization, one re-crystallizes by solid phase epitaxy the amorphized material including the silicon-on-insulator layer, starting from the crystalline top portion of the relaxed SiGe layer. The lattice constant of the crystalline SiGe at the point of its interface with the amorphous material will have to be accommodated during the re-crystallization. Since the lattice constant at the crystalline/amorphous interface was larger than that of the Si layer, the Si layer upon re-crystallization will be in a tensile strain state due to having had to accommodate the larger lattice constant of the top part of the relaxed SiGe layer. Once the SiGe layer is removed, one obtains the tensilely strained silicon-on-insulator layer.

There can be several variations in the embodiments of creating the tensilely strained silicon-on-insulator layer.

In one alternate embodiment of the invention, the process of amorphization and solid-state epitaxy is iterated to allow a gradual building up of the strain in the SOI layer. The amorphized portion of the graded SiGe layer is increased with each iteration so that re-crystallization is commencing with a seed having ever higher Ge concentration. Successive iterations strain the SOI layer to higher levels of strain by re-crystallizing it from a region having a higher Ge concentration, thus larger lattice constant.

In yet another embodiment of the invention, the process is iterated by removing and reforming the graded SiGe layer after each re-crystallization, and each time the layer is re-formed with a higher Ge concentration. Each iteration leaves the SOI layer with a higher level of strain.

It is the object of the present invention to present a method by which tensile strain is introduced into a silicon-on-insulator layer. It is also the object of the present invention to teach a tensilely strained silicon-on-insulator, and fabrication methods thereof. It is yet another object of the present invention to teach electronic systems which comprise a tensilely strained silicon-on-insulator layer. It is a further object of the present invention to teach the generality of the method for changing a strain state of a crystalline layer on top of a support platform.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
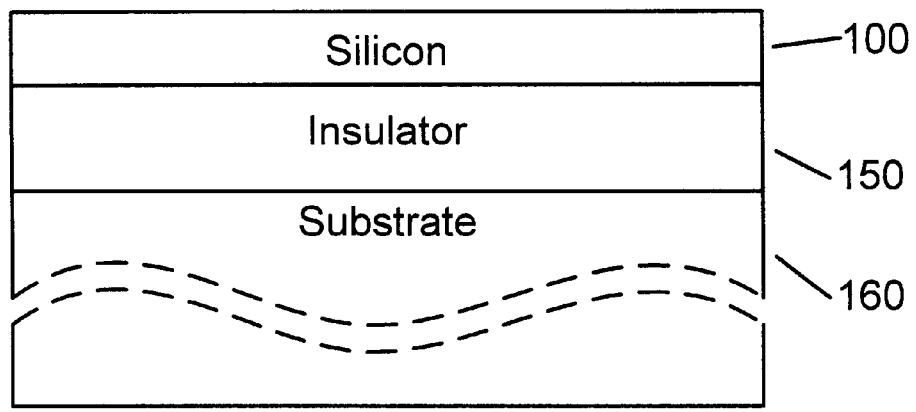
FIG. 1 Shows a schematic cross sectional view of a layered structure of the silicon-on-insulator wafer.

FIG. 1 shows a schematic cross sectional view of a layered structure of the silicon-on-insulator wafer. Taking such a wafer is the starting point of this invention. The wafer is a layered structure with a buried $SiO_2$ layer 150 sandwiched between a Si substrate 160 and a monocrystalline Si layer 100. The Si layer 100 has a first lattice constant, which is the relaxed lattice constant of Si. SOI wafers are know in the art and are commercially available. Typically they are manufactured by techniques such as separation by implanted oxygen (SIMOX), or wafer bonding. The thickness of the Si layer 100 can vary. Advanced device fabrication requires ever thinner structures. Also, the thinner the Si layer is, the more strain it can withstand without sacrificing crystal quality. Accordingly, the range of Si layer 100 thicknesses is about between 1 nm and 100 nm, and preferably about between 2 nm and 50 nm. This thickness does not change appreciably during the execution of the steps of this invention.

Figure 2:
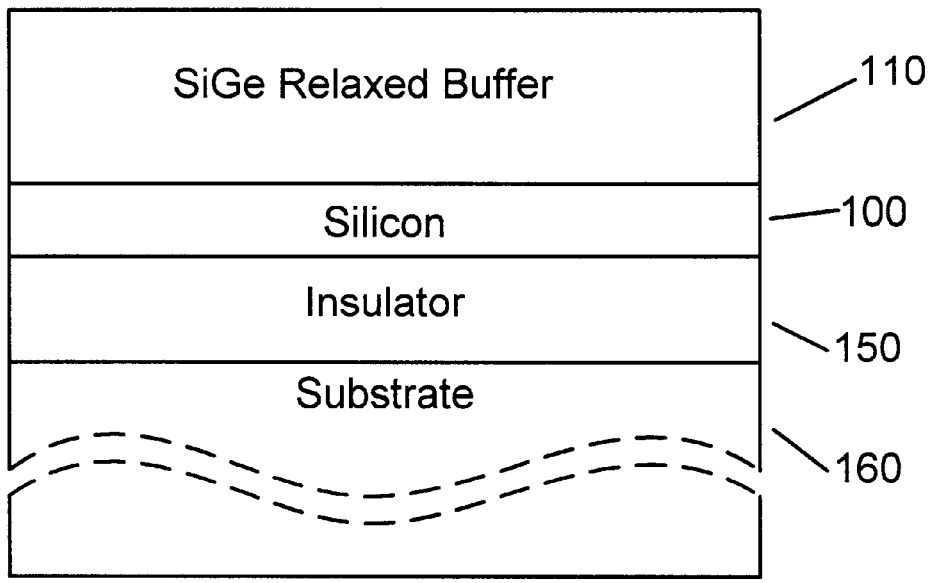
FIG. 2 Shows a schematic cross sectional view of the layered structure with a SiGe relaxed layer formed on top of the silicon-on-insulator wafer.

FIG. 2 shows a schematic cross sectional view of the layered structure with a SiGe relaxed layer 110 formed on top of the silicon-on-insulator wafer. Typically such a relaxed SiGe layer has a graded Ge concentration. A characteristic grading of the Ge concentration in layer 110 will have about 5% Ge at the bottom of the layer, where it forms a first interface with the Si layer, and about 30% Ge at the top surface of the SiGe layer. How to form such a relaxed SiGe layer is known in the art. There are several processes available for fabricating them, such as by step grading process as described by in the incorporated U.S. Pat. No. 5,659,187 to LeGoues et al. An alternate process of mention is by an implant and anneal process, as described by S. H. Christiansen, et al in "Relaxed SiGe Layers on Si or Silicon on Insulator Substrates by Ion Implantation and Thermal Annealing" in US patent applications: U.S. Ser. No. 10/115160, filed on Apr. 3, 2002, incorporated herein by reference, and U.S. Ser. No. 10/299880 filed Nov. 19, 2002 incorporated herein by reference. It is noted that a relaxed SiGe buffer layer 100 fabricated by the He implant and anneal process contains a region of defects. This defect region in the SiGe layer is not an issue in this invention since it is being amorphized during the implant step of the invention.

The thickness of the SiGe relaxed layer 110 can be in a relatively wide range, depending on the amount of strain desired in the Si layer 100, and the method by which layer 110 is formed. A step grading method typically requires thicker layers, ranging up to about 3000 nm, while other methods, such as the implant and anneal process can be done with a minimum thickness for layer 110 of about 20 nm.

Figure 3:
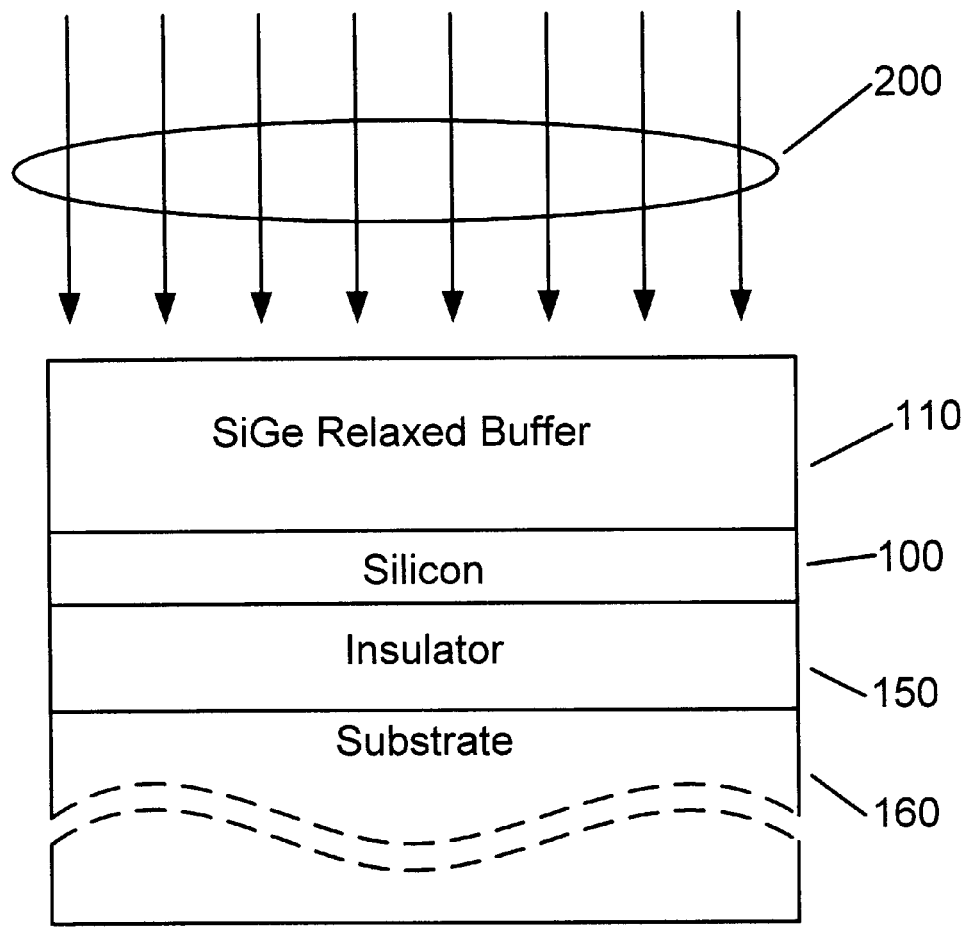
FIG. 3 Shows a schematic cross sectional view of the implantation of the layered structure.

FIG. 3 shows a schematic cross sectional view of the implantation of the layered structure. Converting the Si layer 100 and the bottom portion of the SiGe layer 110 into an amorphous state of material is the aim of the ion implantation, indicated by arrows 200. The implanted species is typically Si or Ge, however one skilled in the art would recognize other species can serve the purpose, as well. The implant energy and dose are chosen such that the bottom part of the SiGe buffer layer 110 and the SOI layer 100 become amorphized.

Figure 4:
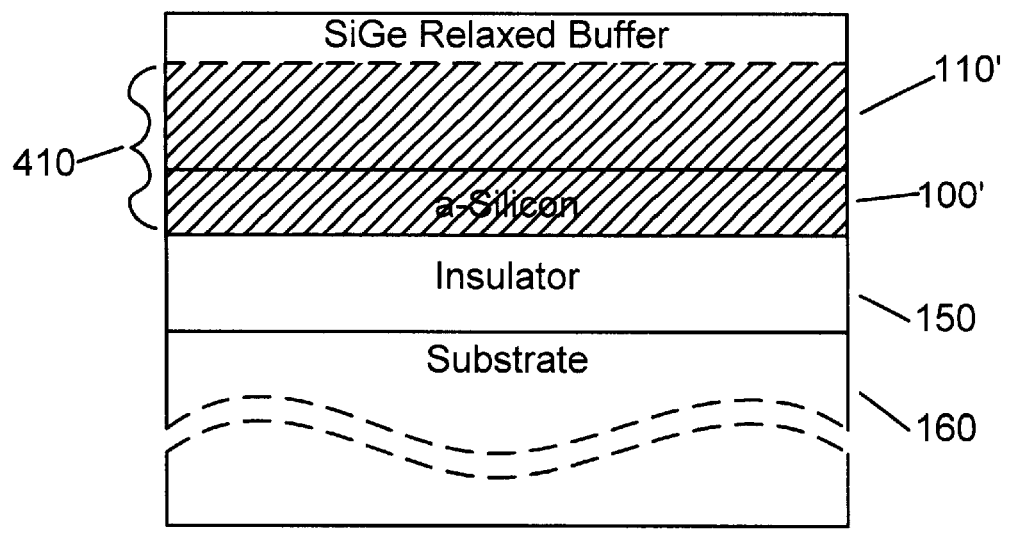
FIG. 4 Shows a schematic cross sectional view of the layered structure with the Si and the bottom part of the SiGe relaxed layer amorphized.

FIG. 4 shows a schematic cross sectional view of the layered structure with the Si and the bottom part of the SiGe relaxed layer amorphized. Following the implant 200, the bottom part of the SiGe buffer layer 110' and the SOI layer 100' are amorphized. The notations with the "prime" symbol added indicate that while these are the same layers as earlier, their material state changed, (for the SiGe layer only partially, since it is only partially amorphized). The extension of the amorphous semiconductor layers is shown by the curly brackets 410. In the SiGe layer the amorphous region goes from the interface with the Si layer, a first interface, up to a second interface which is between the amorphous and crystalline portions of the SiGe layer. The top portion of the SiGe layer is not amorphized and remains monocrystalline.

Figure 5:
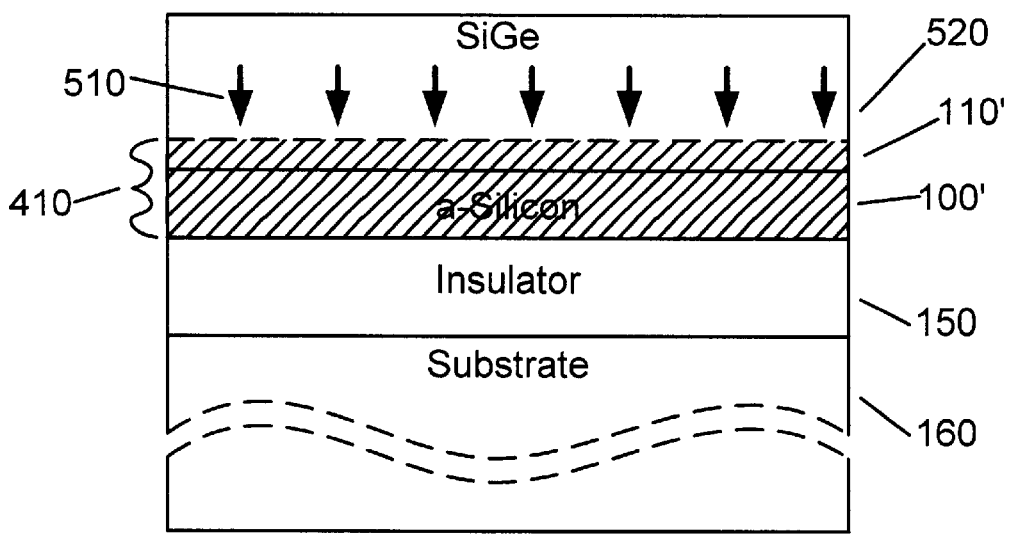
FIG. 5 Shows a schematic cross sectional view of the initial stage of re-crystallization by solid phase epitaxy.

FIG. 5 shows a schematic cross sectional view of the initial stage of re-crystallization by solid phase epitaxy. As the structure is being annealed the amorphized portion of the layered structure 410 is shrinking. The re-crystallization growth, indicated by arrows 510, propagates downwards from its original seeding place on the second interface, where the SiGe crystalline layer had a second lattice constant which was larger than the first lattice constant of the Si layer. As shown in FIG. 5, part of the SiGe layer 110' and Si layer 100' are still amorphous. The crystalline top portion of the SiGe layer is now extending downwards. In the case of a graded SiGe film the crystalline SiGe layer is no longer relaxed, having taken on the lattice constant of the second interface. Hence the strained crystalline SiGe layer is annotated as layer 520.

Figure 6:
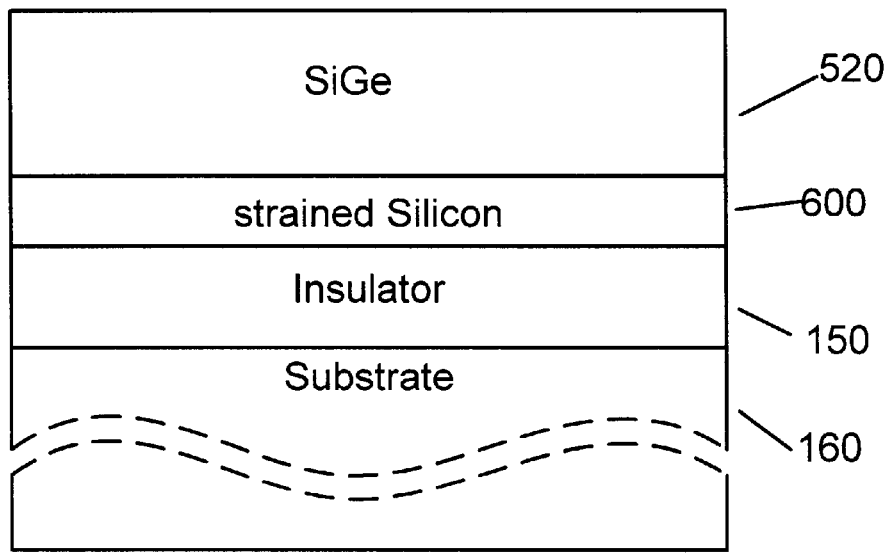
FIG. 6 Shows a schematic cross sectional view of the layered structure after re-crystallization, wherein the Si layer acquired a tensile strain.

FIG. 6 shows a schematic cross sectional view of the layered structure after re-crystallization, wherein the Si layer has acquired a tensile strain. The part of the SiGe layer which was amorphized is now strained, which is indicated with the new annotation 520 referring to the whole layer. In this figure the Si layer is being forced to comply with the second lattice constant, and is acquiring a tensile strain. It has become the tensilely strained silicon-on-insulator 600. With this, the method for introducing the tensile strain in the silicon-on-insulator layer is complete. To fabricate a silicon-on-insulator layer that can be used to house devices and circuits, one has to remove the SiGe layer from the top of the strained Si layer. Methods for such removal are known in the art, and are typically done by selective etching, such as with $1HF:2H_2O_2:3CH_3COOH$. The use of a selective SiGe etchant is especially useful with a relaxed SiGe film having a uniform Ge concentration that extends down to the SiGe/Si interface (which is typically the case when the relaxed SiGe layer is made by the implantation and anneal method). With graded SiGe buffer layers it is some time preferable to incorporate a stop-etch layer or marker at the SiGe/Si interface. For example a boron delta-doping is sometime used as a stop-etch layer for both wet and dry etching.

Figure 7:
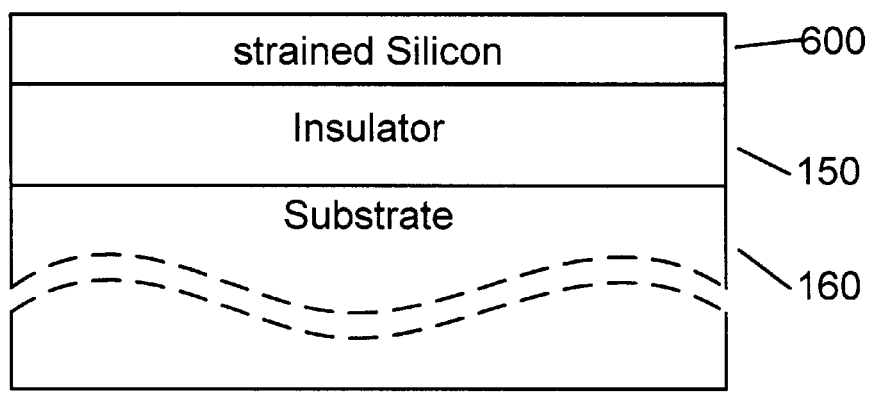
FIG. 7 Shows a schematic cross sectional view of the silicon-on-insulator wafer with the strained Si layer.

FIG. 7 shows a schematic cross sectional view of the silicon-on-insulator wafer with the strained Si layer. The strained SiGe layer 520 has been removed, leaving the strained Si layer 600 exposed on the surface. The Si layer 600 is adhered to the insulator layer 150, typically an $SiO_2$ layer. The tensilely strained Si layer is of device quality with low defect densities, below $10^8/cm^2$, and preferably below $10^5/cm^2$.

This layered structure shows the effects of the ion implantation 200 used for amorphization. When the Si layer 100 was completely amorphized, then due to the natural spread of the implanted ions, some of the ions penetrated into the insulator layer. These ions stay in the insulator permanently. They have no detrimental electrical effects, but they can be shown to be in the insulator. Of several possible ways to show their existence, one is by the fact that the presence of the implanted species slightly alters the chemical composition of the insulator, which is typically $SiO_2$. Due to the implanted ions the insulator layer contains at least one atomic species over a limit, which limit is the one that one can establish based on the known chemical composition of the insulator layer. For instance, if the insulator is $SiO_2$ and the implanted species is also Si, then the $SiO_2$ upon investigation would show some excess of Si, compared to the natural amount of Si expected on the basis or the $SiO_2$ chemical formula.

The strained SOI layered structure created by the current invention strains the Si layer already present on the original SOI wafer, it does not involve a layer transfer. Consequently, the crystalline orientation of the original Si layer is preserved throughout the straining process. If the original Si layer had the same crystalline orientation as the substrate underneath the insulator, which is the case when the SIMOX process has been used to create the original SOI wafer, the final, strained Si layer too, will match the crystalline orientation of the underlying Si substrate.

Depending on circumstances, the method for tensilely straining an SOI layer can be executed in differing embodiments. In one such embodiment, aimed to gradually adjust the matching between the Si layer and the underlaying insulator one repeats the converting and the re-crystallizing steps at least once, but possibly several times. In this embodiment of the method, after reaching the state of the layered structure as shown in FIG. 6, one goes back to ion implantation of FIG. 3, followed by re-crystallization of FIG. 5. This is done in a manner that at each repetition a larger portion of the SiGe layer is turned into amorphous material. In this way at the second interface, which serves as the seeding surface for the solid phase re-crystallization, the second lattice constant is increasing with each repetition, whereby the tensile strain in the Si layer is also increasing with each repetition. When the tensile strain in the Si layers has reached a predetermined, or desired, value the repetitions are terminated and the SiGe relaxed layer is removed.

In another embodiment, aimed increasing strain without having to form unduly thick SiGe layers, and also for the sake of general flexibility, one repeats the forming, converting, re-crystallizing, and removing steps at least once, but possibly several times. With each removing step the SOI wafer is provided anew and it is ready to be taken again for processing. In this embodiment of the method, after reaching the state of the layered structure shown in FIG. 7 one goes back to forming the relaxed SiGe layer as shown on FIG. 2, following with the usual order of ion implantation of FIG. 3, by re-crystallization of FIG. 5, and again removal of the SiGe layer as on FIG. 7. At each of these repetition cycles the SiGe layer is formed on an ever more strained Si layer and a higher Ge concentration can be reached near, or at the top, of the SiGe relaxed layer, resulting in a larger lattice constant. Consequently, at the second interface the second lattice constant is increasing with each repetition, whereby the tensile strain in the Si layer also increases with each repetition. When the tensile strain in the Si layers has reached a predetermined, or desired, value the repetitions are terminated and no new SiGe relaxed layer is formed on top of the strained Si layer.

Figure 8:
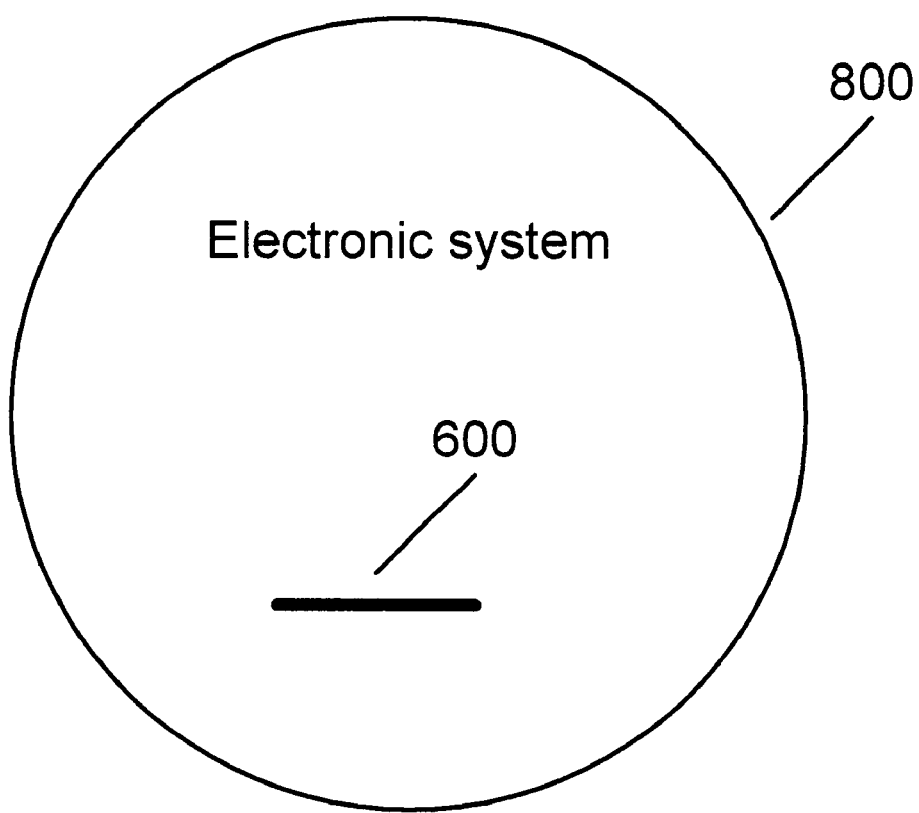
FIG. 8 Schematically shows an electronic system containing the tensilely strained Si on insulator layer as its component.

FIG. 8 schematically shows an electronic system containing the tensilely strained Si on insulator layer as its component. In the figure the electronic system is shown in a generic way as a sphere 800, comprising the strained Si on insulator layer 600. The strained Si on insulator layer 600 is hosting a variety of high performance devices and circuits. Electronic systems that can take advantage of the high performance devices afforded by the strained Si on insulator are of many kind. It is of special interest when such an electronic systems is a digital processor, such as a central electronic complex (CEC) of a computer.

The steps of the method for tensilely straining a Si layer on an insulator can be applied in general for modifying the strain state of any crystalline layer, or simply a first crystalline layer, having a first lattice constant, resting on a support platform. The support platform is preferably amorphous, whereby it does not influence the lattice constant of the first crystalline layer. One has to form an epitaxial relaxed monocrystalline second crystalline layer on top of the first crystalline layer, in such a way that near its top surface the second crystalline layer has a second lattice constant, which differs from the first lattice constant. Again the first layer and the bottom portion of the second layer, which is interfacing with the first layer are turned into amorphous state by ion implantation. Upon re-crystallization by solid phase epitaxy the first crystalline layer, by being forced to comply with the second lattice constant, has its strain state modified. This modification depends on the relation of the first lattice constant to the second lattice constant. If the second lattice constant is larger than the first lattice constant, as is the case for the Si layer and the SiGe relaxed layer, then the first layer's strain state will be modified in the tensile direction. In the opposite case, when the second lattice constant is smaller than the first lattice constant, then the first layer's strain state will be modified in the compressive direction. Removing the second layer will yield the modified strain state first layer on top of the original support structure.

Many modifications and variations of the present invention are possible in light of the above teachings, and could be apparent for those skilled in the art. The scope of the invention is defined by the appended claims.

We claim:

1. A method for tensilely straining a Si layer on an insulator, comprising the steps of:
    taking a silicon-on-insulator wafer, said wafer comprising a buried insulator layer sandwiched between a Si substrate and a monocrystalline Si layer, said Si layer having a first lattice constant;
    forming an epitaxial relaxed SiGe layer on top of said Si layer;
    converting said Si layer and a bottom portion of said SiGe layer into an amorphous state by an ion implantation, wherein said bottom portion of said SiGe layer is sharing a first interface with said Si layer; and
    re-crystallizing said bottom portion of said SiGe layer and said Si layer by solid phase epitaxy, said solid phase epitaxy seeding from a second interface between a crystalline top portion of said SiGe layer and said amorphous bottom portion of said SiGe layer, wherein at said second interface said top portion of said SiGe layer having a second lattice constant, said second lattice constant being larger than said first lattice constant, whereby upon re-crystallization said Si layer is forced to comply with said second lattice constant and acquires a tensile strain.

2. The method of claim 1, wherein said Si layer is chosen to be between about 1 nm and 100 nm thick.

3. The method of claim 2, wherein said Si layer is chosen to be between about 2 nm and 50 nm thick.

4. The method of claim 1, wherein in said ion implantation an implanted species is chosen to be Si.

5. The method of claim 1, wherein in said ion implantation an implanted species is chosen to be Ge.

6. The method of claim 1, wherein said relaxed SiGe layer is formed to a thickness between about 20 nm and 3000 nm.

7. The method of claim 1, wherein said buried insulator layer is chosen to be $SiO_2$.

8. A method for fabricating a tensilely strained Si layer on an insulator, comprising the steps of:
    taking a silicon-on-insulator wafer, said wafer comprising a buried insulator layer sandwiched between a Si substrate and a monocrystalline Si layer, said Si layer having a first lattice constant;
    forming an epitaxial relaxed SiGe layer on top of said Si layer;
    converting said Si layer and a bottom portion of said SiGe layer into an amorphous state by an ion implantation, wherein said bottom portion of said SiGe layer is sharing a first interface with said Si layer;
    re-crystallizing said bottom portion of said SiGe layer and said Si layer by solid phase epitaxy, said solid phase epitaxy seeding from a second interface between a crystalline top portion of said SiGe layer and said amorphous bottom portion of said SiGe layer, wherein at said second interface said top portion of said SiGe layer having a second lattice constant, said second lattice constant being larger than said first lattice constant, whereby upon re-crystallization said Si layer is forced to comply with said second lattice constant and acquires a tensile strain; and
    removing said SiGe layer, whereby said silicon-on-insulator wafer has been transformed into a wafer comprising said tensilely strained Si layer.

9. The method of claim 8, wherein said Si layer is chosen to be between about 1 nm and 100 nm thick.

10. The method of claim 9, wherein said Si layer is chosen to be between about 2 nm and 50 nm thick.

11. The method of claim 8, wherein in said ion implantation an implanted species is chosen to be Si.

12. The method of claim 8, wherein in said ion implantation an implanted species is chosen to be Ge.

13. The method of claim 8, wherein said buried insulator layer is chosen to be $SiO_2$.

14. The method of claim 8, wherein said relaxed SiGe layer is formed by a step grading process.

15. The method of claim 8, wherein said relaxed SiGe layer is formed by an implant and anneal process.

16. The method of claim 8, wherein said relaxed SiGe layer is formed to a thickness between about 20 nm and 3000 nm.

17. The method of claim 8, further comprising the steps of:
  repeating at least once the converting and the re-crystallizing steps in a manner that with each repetition at said second interface said second lattice constant is increasing with each repetition, whereby said tensile strain in said Si layer also increases with each repetition; and
  terminating said repeating when said tensile strain in said Si layer has reached a predetermined value.

18. A method for fabricating a tensilely strained Si layer on an insulator, comprising the steps of:
  taking a silicon-on-insulator wafer, said wafer comprising a buried $SiO_2$ layer sandwiched between a Si substrate and a monocrystalline Si layer, said Si layer having a first lattice constant;
  forming an epitaxial relaxed SiGe layer on top of said Si layer;
  converting said Si layer and a bottom portion of said SiGe layer into an amorphous state by an ion implantation, wherein said bottom portion of said SiGe layer is sharing a first interface with said Si layer;
  re-crystallizing said bottom portion of said SiGe layer and said Si layer by solid phase epitaxy, said solid phase epitaxy seeding from a second interface between a crystalline top portion of said SiGe layer and said amorphous bottom portion of said SiGe layer, wherein at said second interface said top portion of said SiGe layer having a larger lattice constant than said first lattice constant, whereby upon re-crystallization said Si layer is forced to comply with said larger lattice constant and acquires a tensile strain;
  removing said SiGe layer, whereby a silicon-on-insulator wafer has been provided anew, with said Si layer tensilely strained by having said first lattice constant increased;
  repeating at least once the growing, converting, re-crystallizing and removing steps with said provided anew silicon-on-insulator wafer, in a manner that at said second interface said second lattice constant is increasing with each repetition, whereby said tensile strain in said Si layer also increases with each repetition; and
  terminating said repeating when said tensile strain in said Si layer has reached a predetermined value.

19. A method for modifying a strain state in a first crystalline layer on a support platform, comprising the steps of:
  taking said first crystalline layer on said support platform, said first crystalline layer having a first lattice constant;
  forming an epitaxial relaxed second crystalline layer on top of said first crystalline layer;
  converting said first crystalline layer and a bottom portion of said second crystalline layer into an amorphous state by an ion implantation, wherein said bottom portion of said second crystalline layer is sharing a first interface with said first crystalline layer; and
  re-crystallizing said bottom portion of said second crystalline layer and said first crystalline layer by solid phase epitaxy, said solid phase epitaxy seeding from a second interface between a crystalline top portion of said second crystalline layer and said amorphous bottom portion of said second crystalline layer, wherein at said second interface said top portion of said second crystalline layer having a second lattice constant, said second lattice constant differing from said first lattice constant, whereby upon re-crystallization said first crystalline layer by being forced to comply with said second lattice constant has its said strain state modified.

20. The method for modifying a strain state of claim 19, further comprising the step of:
  removing said second crystalline layer from said first crystalline layer, following said re-crystallizing step.

21. The method for modifying a strain state of claim 19, wherein said support platform is comprising an amorphous material, wherein said amorphous material interfacing with said first crystalline layer.

* * * * *